United States Patent [19]

Miwa

[11] Patent Number: 5,991,189
[45] Date of Patent: Nov. 23, 1999

[54] FERROELECTRIC RANDOM ACCESS MEMORY DEVICES HAVING SHORT-LIVED CELL DETECTOR AVAILABLE FOR LIFE TEST FOR FERROELECTRIC CAPACITOR AND METHOD FOR TESTING FERROELECTRIC MEMORY CELLS

[75] Inventor: Tohru Miwa, Tokyo, Japan

[73] Assignee: NEC Corporation, Tokyo, Japan

[21] Appl. No.: 09/192,528

[22] Filed: Nov. 17, 1998

[30] Foreign Application Priority Data

Nov. 19, 1997 [JP] Japan ................................. 9-318636

[51] Int. Cl.$^6$ ................................................ G11C 11/22
[52] U.S. Cl. ......................... 365/145; 365/201; 365/205
[58] Field of Search ................................. 365/145, 149, 365/201, 205

[56] References Cited

U.S. PATENT DOCUMENTS

| | | |
|---|---|---|
| 5,086,412 | 2/1992 | Jaffe et al. ............................. 365/145 |
| 5,254,482 | 10/1993 | Fisch ..................................... 365/145 |
| 5,297,077 | 3/1994 | Imai et al. ............................. 365/145 |
| 5,677,865 | 10/1997 | Seyyedy ................................. 365/145 |

FOREIGN PATENT DOCUMENTS

63-201998  8/1988  Japan .

*Primary Examiner*—Son T. Dinh
*Attorney, Agent, or Firm*—Sughrue, Mion, Zinn, Macpeak & Seas, PLLC

[57] ABSTRACT

A ferroelectric random access memory device stores a data bit in a pair of ferroelectric capacitors in the form of remanence varied along a hysteresis loop, and a sense amplifier increases the magnitude of a potential difference produced on a bit line pair due to the remanence, wherein the insensible voltage range of the sense amplifier is intentionally increased in a life test for the pair of ferroelectric capacitors so as to screen out a short-lived ferroelectric capacitor.

11 Claims, 4 Drawing Sheets

Fig. 5

FERROELECTRIC RANDOM ACCESS MEMORY DEVICES HAVING SHORT-LIVED CELL DETECTOR AVAILABLE FOR LIFE TEST FOR FERROELECTRIC CAPACITOR AND METHOD FOR TESTING FERROELECTRIC MEMORY CELLS

FIELD OF THE INVENTION

This invention relates to a ferroelectric random access memory device and, more particularly, to a ferroelectric random access memory device having a built-in life tester for ferroelectric capacitors and a method for testing memory cells.

DESCRIPTION OF THE RELATED ART

The ferroelectric random access memory device stores data bits in ferroelectric memory cells in the form of remanence. A typical example of the ferroelectric memory cell has a pair of ferroelectric capacitors and two access transistors. The ferroelectric capacitors of the pair are oppositely polarized, and the direction of the remanence is representative of the logic level of the stored data bit.

Figure 1:
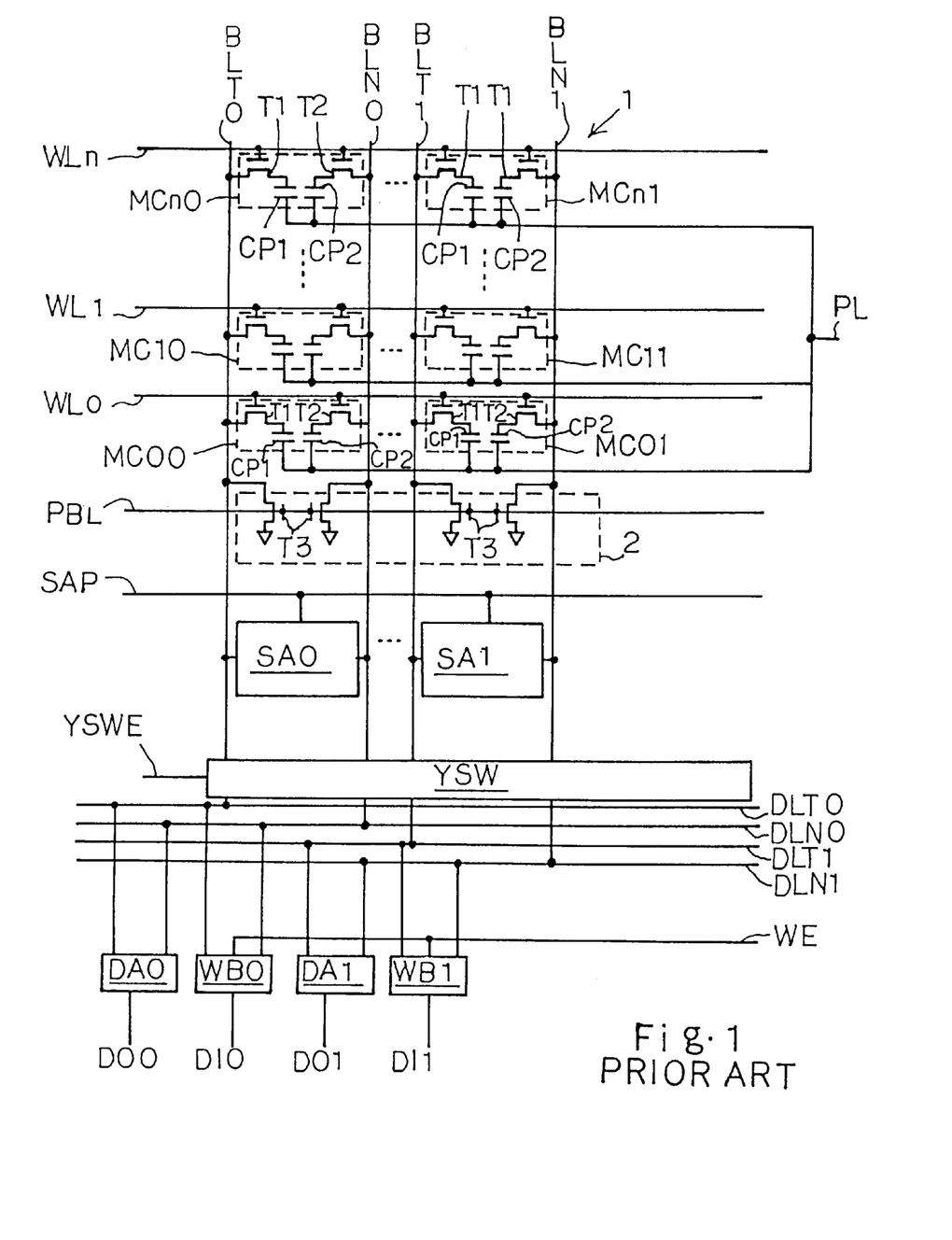
FIG. 1 is a circuit diagram showing the prior art ferroelectric random access memory device.

A typical example of the ferroelectric random access memory device is disclosed in Japanese Patent Publication of Unexamined Application No.63-201998. FIG. 1 illustrates the prior art ferroelectric random access memory device. Plural ferroelectric memory cells MC00 to MC01, MC10 to MC11, . . . and MCn0 to MCn1 form in combination a memory cell array 1, and the memory cell array I is associated with bit line pairs BLT01 BLN0 to BLT1/BLN1 and word lines WL0 to WLn. The bit line pairs BLT0/BLN0 to BLT1/BLT1 are respectively connected to the columns of ferroelectric memory cells MC00–MCn0 to MC01–MCn1, and the word lines WL0 to WLn are connected to the rows of ferroelectric memory cells MC00 to MC01, MC10 to MC11 and MCn0 to MCn1, respectively.

Each ferroelectric memory cell has a pair of ferroelectric capacitors CP1/CP2 and two n-channel enhancement type access transistors T1/T2 connected between the ferroelectric capacitors CP1/CP2 and the associated bit lines BLT0/BLN0 or BLT1/BLN1. The gate electrodes of the n-channel enhancement type access transistors T1/T2 are connected to the associated word line WL0, WL1 . . . or WLn. A plate line PL is connected to the counter electrodes of all the ferroelectric capacitors CP1/CP2.

The prior art ferroelectric random access memory device further comprises a discharging circuit 2, and n-channel enhancement type discharging transistors T3 form in combination the discharging circuit 2. The n-channel enhancement type discharging transistors T3 are connected between the bit lines BLT0/BLN0 to BLT1/BLN1 and a ground line, and a control signal line PBL is connected to the gate electrodes of the n-channel enhancement type discharging transistors T3. When the control signal line PBL is changed to active high level Vcc, the n-channel enhancement type discharging transistors T3 concurrently turn on, and all the bit lines BLT0/BLN0 to BLT1/BLN1 are changed to the ground level. After the discharging, a word line WL0, WL1 or WLn is changed to active high level, and the n-channel enhancement type access transistors T1/T2 of the associated ferroelectric memory cells turn on. Then, the pairs of ferroelectric capacitors CP1/CP2 of the associated ferroelectric memory cells produce small potential differences on the bit line pairs BLT0/BLN0 to BLT1/BLN1, respectively.

The prior art ferroelectric random access memory device further comprises sense amplifiers SA0 to SA1, and the sense amplifiers SA0 to SA1 are of a latch type. A control signal line SAP causes the sense amplifiers SA0 to SA1 to increase the magnitude of the small potential differences. One of the bit lines of each pair goes up to the high voltage level Vcc, and the other of the bit lines goes down to the ground level.

Figure 2:
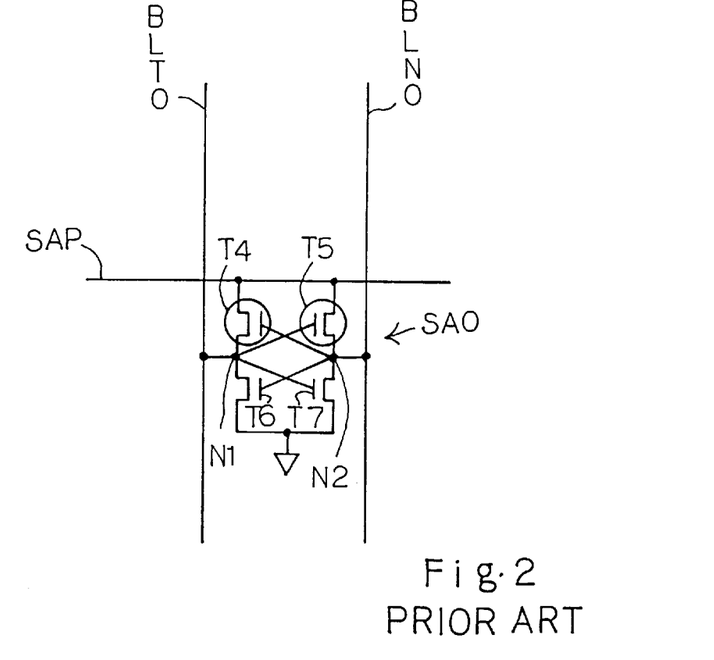
FIG. 2 is a circuit diagram showing the circuit configuration of the sense amplifier incorporated in the prior art ferroelectric random access memory device.

The sense amplifiers SA0 to SA1 are similar in circuit configuration, and FIG. 2 illustrates the sense amplifier SA0. The sense amplifier SA0 includes p-channel enhancement type field effect transistors T4/T5 connected in parallel to the control signal line SAP and n-channel enhancement type field effect transistors T6/T7 connected between the p-channel enhancement type field effect transistors T4/T5 and the ground line. The sense amplifier has sense nodes N1/N2 at the common drain nodes between the p-channel enhancement type field effect transistors T4/T5 and the n-channel enhancement type field effect transistors T6/T7. The sense node N1 is connected to the gate electrode of the p-channel enhancement type field effect transistor T5 and the gate electrode of the n-channel enhancement type field effect transistor T7. The other sense node N2 is connected to the gate electrode of the p-channel enhancement type field effect transistor T4 and the gate electrode of the n-channel enhancement type field effect transistor T6. When the control signal line SAP is changed to the high voltage level Vcc, the p-channel enhancement type field effect transistors T4/T5 and the n-channel enhancement type field effect transistors T6/T7 complementarily turn on and off depending upon the potential levels at the sense nodes N1/N2, and increase the potential difference between the sense nodes N1 and N2.

The prior art ferroelectric random access memory device further comprises a column selector YSW connected to the bit line pairs BLT0/BLN0 to BLT1/BLN0, data line pairs DLT0/DLN0 and DLT1/DTN1 connected to the column selector YSW, data amplifiers DA0/DA1 respectively connected to the data line pairs DLT0/DLN0 and DLT1/DLN1 and write buffers WB0/ WBI also connected to the data line pairs DLT0/DLN0 and DLT1/DLN1, respectively. The column selector YSW is responsive to selecting signals on control signal lines YSWE, and selectively connects the bit line pairs BLT0/ BLN0 to BLT1/BLT1 to the data line pairs DLT0/DLN0 and DLT1/DLN1. When the selecting signal is in the high voltage level Vcc, the potential differences are directly transferred from selected bit line pairs to the associated data line pairs. A write-enable signal is supplied through a control signal line WE to the write buffers W0/WB1, and the write buffers WB0/ WB1 are enabled with the write-enable signal of the active high voltage level Vcc so as to produce potential differences representative of write-in data bits DI0/DI1on the associated data line pairs DLT0/DLN0 and DLT1/DLN1. The potential differences representative of the write-in data bits DI0/DI1 are transferred through the column selector YSW to selected bit line pairs, and the write-in data bits are stored into selected ferroelectric memory cells. The data amplifiers DA0/DA1 are responsive to the potential differences on the data line pairs DLT0/DLN0 and DLT1/DLN1 so as to produce output data signals DO0/DO1 representative of the read-out data bits.

When the memory cells MCn0 and MCn1 are accessed, the control signal line PBL is firstly changed to the high voltage level, and all the bit lines BLT0/BLN0 to BLT1/BLT1 are discharged through the n-channel enhancement type discharging transistors T3 to the ground line. The control signal line PBL is recovered to the low voltage level, and the bit lines BLT0/ BLN0 to BLT1/BLT1 enter into floating state.

Subsequently, the word line WLn is changed to the active high level, and the active high level on the selected word line WLn causes the n-channel enhancement type access transistors T1/T2 of the ferroelectric memory cells MCn0 to MCn1 to turn on. Then, the ferroelectric capacitors CP1 and the ferroelectric capacitors CP2 are connected to the bit lines BLT0 to BLT1 and the bit lines BLN0 to BLT1.

Subsequently, the plate line PL is changed to the high voltage level Vcc, and the high voltage level Vcc causes the ferroelectric capacitors CP1/CP2 to supply electric charge to the associated bit lines BLT0D BLN0 to BLT1/BLN1, respectively. The high voltage level Vcc on the plate line PL inverts the polarity of one of the ferroelectric capacitors CP1/CP2 of each memory cell, and a large amount of electric charge is supplied to the associated bit line. However, the other of the ferroelectric capacitors CP1/CP2 is never inverted, and no electric charge is supplied to the associated bit line. As a result, small potential differences are produced on the bit line pairs BLT0/BLN0 to BLT1/BLT1, respectively.

The small potential differences are propagated through the bit line pairs BLT0/BLN0 to BLT1/BLT1 to the sense amplifiers SA0 to SA1, respectively. The control signal line SAP is changed to the high voltage level Vcc, and the sense amplifiers SA0 to SA1 increase the small potential differences. Each sense amplifier SA0/SA1 pulls down one of the bit lines of the associated pair to the ground level, and pulls up the other of the bit lines to the high voltage level Vcc. Thus, large potential differences are produced on the bit line pairs BLT0/BLN0 to BLT1/BLT1, respectively.

After the sense amplification, the selecting signals YSWE cause the column selector YSW to selectively connect the bit line pairs BLT0/BLN0 to BLT1/BLN1 to the data line pairs DLT0/DLN0 and DLT1/DLN1. Thus, the large potential differences are transferred from the selected bit line pairs BLT0/BLN0 and BLT1/BLT1 to the data line pairs DLT0/DLN0 and DLT1/DLN1, respectively. The data amplifiers produces the output data signals DO0/DO1 from the large potential differences on the data line pairs DLT0/DLN0 and DLT1/DLN1.

The high voltage level Vcc on the plate line PL destroys the data bits stored in the ferroelectric memory cells MCn0 to MCn1, and a write-back is required for the ferroelectric memory cells MCn0 to MCn1. The write-back is carried out as follows.

While the plate line PL is staying at the high voltage level Vcc, one of the ferroelectric capacitors CP1/CP2 of each memory cell maintains the previous polarization. The sense amplifier changes the associated bit line to the ground level, and the potential difference (Vcc–Ground level) is appropriately applied between the associated bit line and the plate line PL. One the other hand, the other of the ferroelectric capacitors CP1/CP2 has been forced to invert the polarity, and requires an inversion of polarity, again. The plate line PL is changed to the ground level during the activation of the sense amplifiers SA0 to SA1, and the potential difference (Vcc–Ground level) forces the other ferroelectric capacitor to invert the polarity. Thus, the other ferroelectric capacitor is recovered to the previous polarity.

The control signal line PBL is changed to the ground level, and the ground level on the control signal line PBL deactivates the sense amplifiers SA0 to SA1. Subsequently, the control signal line PBL is changed to the high voltage level, and the bit lines BLT0/BLN0 to BLT1/BLN1 are discharged to the ground line. Finally, the selected word line is changed to the ground level, and the ferroelectric memory cells MCn0 to MCn1 are isolated from the associated bit line pairs BLT0/BLN0 to BLT1/BLT1, respectively.

The data bits stored in the ferroelectric memory cells MCn0 and MCn1 are replaced with new write-in data bits as follows. In order to prevent the data bits stored in the non-selected ferroelectric memory cells (not shown) connected to the word line WLn from the destruction, the previously described read-out sequence is carried out for the row of ferroelectric memory cells MCn0 to MCn1. The sense amplifiers SA0 to SA1 separate the potential levels on the associated bit line pairs BLT0/BLN0 to BLT1/BLN1 between the high voltage level Vcc and the ground level.

The write-in data bits DI0/DI1 are supplied to the write-in buffers WR0 and WB1, respectively, and the write-in buffers WB0 and WB1 produce potential differences representative of the write-in data bits DI0/DI1 on the data line pairs DLT0/DLN0 and DLT1/DLN1, respectively.

After the sense amplification, the selecting signals YSWE are supplied to the column selector YSW, and the column selector YSW connects the data line pairs DLT0/DLN0 and DLT1/DLN1 to the selected bit line pairs BLT0/BLN0 and BLT1/BLN1, respectively. The potential differences representative of the write-in data bits D0/D1 are transferred from the data line pairs DLT0/DLN0 and DLT1/DLN1 to the selected bit line pairs BLT0/BLN0 and BLT1/BLN1, and are latched by the sense amplifier SA0 and SA1, respectively.

Finally, the prior art ferroelectric random access memory device carries out the write back, i.e., changing the plate line PL to the ground level and discharging the bit lines to the ground line. The ferroelectric capacitors CP1/CP2 of the memory cells MCn0/MCn1 selectively invert the polarity during the write back, if necessary, and the write-in data bits are stored in the ferroelectric memory cells MCn0 and MCn1, respectively.

While the prior art ferroelectric random access memory device is repeating the inversion of the polarity, the ferroelectric capacitors CP1/CP2 decrease the remanence. This phenomenon is called as "fatigue". The small potential difference on a bit line pair is proportional to the remanence of the ferroelectric capacitor CP1/CP2, and is a few tenth of the proportion of the remanence to the parasitic capacitance coupled to the bit line. Therefore, when the remanence is decreased, the small potential difference is also decreased, and reaches the limit of the sensitivity of the sense amplifier SA0/SA1. In other words, when the small potential difference reaches the limit of the sensitivity, the life of the ferroelectric memory cell completes its span.

If a prior art ferroelectric random access memory device contains a short-lived ferroelectric memory cell, the prior art ferroelectric random access memory device becomes defective, and the short-lived ferroelectric memory cell determines the life span of the prior art ferroelectric random access memory device. For this reason, it is desirable to check the ferroelectric memory cells to see whether or not the polarization hysteresis shows the remanence larger than a certain value, because shortsived products should be screened out before delivery from the factory.

SUMMARY OF THE INVENTION

It is therefore an important object of the present invention to provide a ferroelectric random access memory device, in which a short-lived ferroelectric memory cell is easily found in a diagnosis before the delivery.

The present inventor contemplated the problem inherent in the prior art ferroelectric random access memory device. As described hereinbefore, the magnitude of remanence affected the magnitude of potential difference on a bit line pair. If the small potential difference was taken out from the bit line pair, the manufacturer could diagnosed the ferroelectric memory cells. However, the small potential difference was amplified before the output from the ferroelectric random access memory device. For this reason, some built-in circuit is required for the diagnosis. The potential difference on the bit line pair was extremely small, and a high-precision analog circuit was required for the diagnosis. However, such an additional analog circuit consumed real estate, and the semiconductor chip was increased.

In accordance with one aspect of the present invention, there is provided a ferroelectric random access memory device comprising a plurality of addressable memory cells each having a ferroelectric capacitive means for storing a data bit in the form of remanence variable along a hysteresis loop, a plurality of bit lines selectively connected to the plurality of addressable memory cells and propagating potential differences produced due to the remanence of the ferroelectric capacitive means of addressable memory cells selected from the plurality of addressable memory cells therefrom and thereto, a plurality of sense amplifiers selectively connected to the plurality of bit lines for increasing the magnitude of the potential differences, a data interface selectively connected to the plurality of bit lines for producing a diagnostic signal representative of existence of at least one short-lived cell in the addressable memory cells, and a short-lived cell detecting means causing the plurality of sense amplifiers to produce the diagnostic signal when at least one of the addressable memory cells varies the remanence along a small hysteresis loop.

In accordance with another aspect of the present invention, there is provided a semiconductor memory device comprising a plurality of bit line pairs, a plurality of word lines, a plurality of memory cells each including two storage capacitors for storing a data bit and two access transistors having respective current paths connected between the two storage capacitors and the bit lines of associated one of the plurality of bit line pairs and respective gate electrodes connected to associated one of the plurality of word lines, a plurality of sense amplifiers respectively connected to the plurality of bit line pairs, and amplifying potential differences produced from the data bits stored in memory cells selected from the plurality of memory cells, and a short-lived cell detecting means causing the plurality of sense amplifiers to produce a diagnostic signal when at least one of the memory cells is short-lived.

In accordance with yet another aspect of the present invention, there is provided a method for detecting a short-lived cell comprising the steps of writing a test bit in memory cells, making an insensible voltage range of a plurality of sense amplifier connected to a plurality of bit line pairs relatively wide with respect to potential differences on the plurality of bit line pairs representative of the test bits read out from selected memory cells, activating the plurality of sense amplifiers for producing diagnostic signals representative of the test bits, and checking the diagnostic signals to see whether the potential differences are larger than the insensible voltage range or not.

BRIEF DESCRIPTION OF THE DRAWING-S

The features and advantages of the ferroelectric random access memory device will be more clearly understood from the following description taken in conjunction with the accompanying drawings in which.

DESCRIPTION OF THE PREFERRED EMBODIMENTS

First Embodiment

Figure 3:
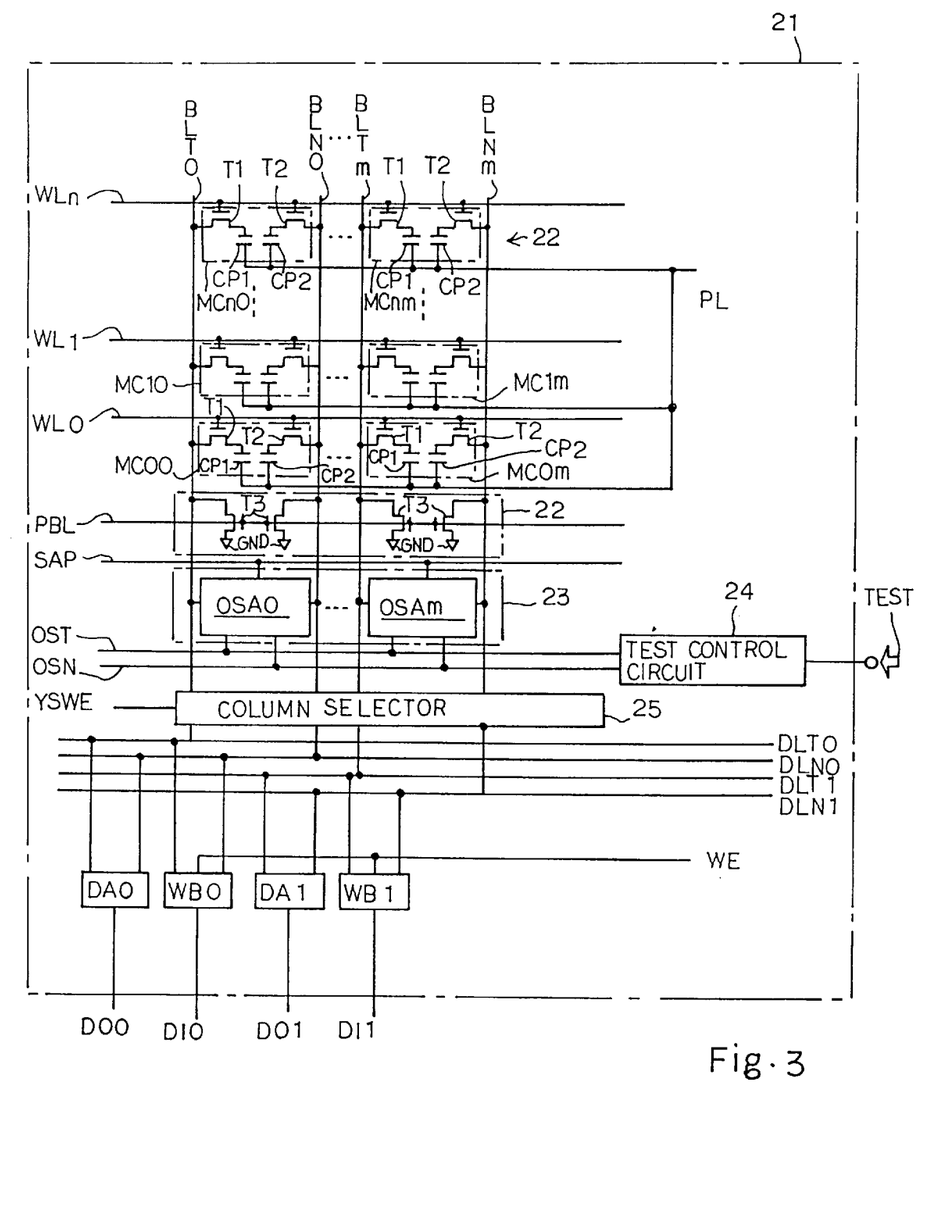
FIG. 3 is a circuit diagram showing a ferroelectric random access memory device according to the present invention.

Referring to FIG. 3 of the drawings, a ferroelectric random access memory device embodying the present invention is fabricated on a semiconductor chip 21. The ferroelectric random access memory device comprises a memory cell array 22 for storing data bits in the form of remanence, bit line pairs BLT0/BLN0 to BLTm/BLNm, word lines WL0 to WLn and a plate line PL. Ferroelectric memory cells MC00 to MC0m, MC10 to MC1m, . . . and MCn0 to MCnm are arranged in rows and columns, and form the memory cell array 22. The bit line pairs BLT0/BLN0 to BLTm/BLNm are respectively connected to the columns of ferroelectric memory cells MC00–MCn0 to MC0m–MCnm, and the word lines WL0 to WLn are connected to the rows of ferroelectric memory cells MC00 to MC0m, MC10 to MC1m, . . . and MCn0 to MCnm, respectively. Though not shown in FIG. 2, a row address decoder/word line driver are connected to the word lines WL0 to WLn, and is responsive to an external row address signal for selectively changing the word lines WL0 to WLn to active voltage level. The bit line pairs BLT0/BLN0 to BLTm/BLNm are electrically connected to a row of ferroelectric memory cells connected to the selected word line, and propagate small potential differences representative of read-out data bits from and large potential differences representative of write-in data bits to the ferroelectric memory cells of the selected row. The row address decoder/word line driver is well known to a person skilled in the art, and no further description is incorporated hereinbelow. The plate line PL is changed between a ground level and a high voltage level Vcc, and causes one of the ferroelectric capacitors CP1/CP2 of each memory cell to invert the polarity. When the polarity is inverted, the ferroelectric capacitor generates electric charge, and the electric charge causes small potential difference on the associated bit line pair BLT0/BLN0, . . . or BLTm/BLNm.

The ferroelectric memory cells MC00 to MCnm are similar in circuit configuration. Each ferroelectric memory cell has a pair of ferroelectric capacitors CP1/CP2 and two n-channel enhancement type access transistors T1/T2 connected between electrodes of the ferroelectric capacitors CP1/CP2 and the associated bit lines BLT0/BLN0, . . . or BLTm/BLNm. The ferroelectric capacitor CP1/CP2 has a ferroelectric layer sandwiched between the electrodes, and the ferroelectric layer has a polarization hysteresis. The gate electrodes of the n-channel enhancement type access transistors T1/T2 are connected to the associated word line WL0, WL1 . . . or WLn. The plate line PL is connected to the counter electrodes of all the ferroelectric capacitors CP1/CP2, and a controller (not shown) changes the plate line PL between the high voltage level Vcc and the ground level.

The ferroelectric random access memory device further comprises a discharging circuit 22, a sense amplifier unit 23 and a test control circuit 24. N-channel enhancement type discharging transistors T3 form in combination the discharging circuit 2, and the n-channel enhancement type discharging transistors T3 are connected between the bit lines BLT0/BLN0 to BLTm/BLNm and a ground line GND. A control signal line PBL is connected to the gate electrodes of the n-channel enhancement type discharging transistors T3. When the control signal line PBL is changed to the active high level Vcc, the n-channel enhancement type discharging transistors T3 concurrently turn on, and all the bit lines BLT0/BLN0 to BLTm/BLNm are changed to the ground level.

The sense amplifier unit 23 includes plural offsetable sense amplifiers OSA0 to OSAm, and the plural offsetable sense amplifiers OSA0 to OSAm are similar in circuit configuration. The offsetable sense amplifiers OSA0 to OSAm have respective input node pairs connected to the associated bit line pairs BLT0/BLN0 to BLTm/BLNm, respective control nodes connected to a control signal line SAP and respective control node pairs connected to other control signal lines OST/OSN. When the control signal line SAP is changed to the high voltage level Vcc, the sense amplifiers OSA0 to OSAm are concurrently activated so as to increase the magnitude of the small potential differences on the associated bit line pairs BLT0/BLN0 to BLTm/BLNm. If the potential difference between the bit line BLT0 to BLTm and the bit line BLN0 to BLNm is defined as (potential level on the bit line BLT0 to BLTm)-(potential level on the associated bit line BLN0 to BLNm), the high voltage level Vcc on the control signal line OST gives an offset voltage +Vo to the offset sense amplifiers OSA0 to OSAm, and the high voltage level Vcc on the control signal line OSN gives the offset voltage -Vo to the offset sense amplifiers OSA0 to OSAm as will be described hereinlater in detail.

The test control circuit 24 is responsive to an external instruction signal representative of a test so as to selectively change the control signal lines OST/OSN at appropriate timings in the test sequence. The test sequence is also described hereinlater in detail.

Figure 4:
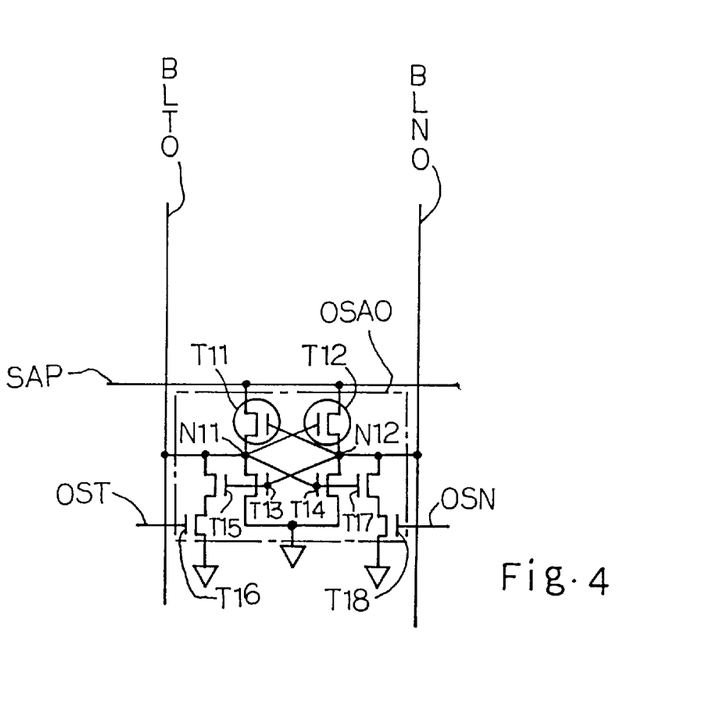
FIG. 4 is a circuit diagram showing the circuit configuration of an offsetable sense amplifier incorporated in the ferroelectric random access memory device.

Turning to FIG. 4 of the drawings, the offsetable sense amplifier OSA0 includes two p-channel enhancement type field effect transistors T11/T12 connected in parallel to the control signal line SAP and two n-channel enhancement type field effect transistors T13/T14 connected between the p-channel enhancement type field effect transistors T11/T12 and the ground line. The common drain nodes between the p-channel enhancement type field effect transistors T11/T12 and the n-channel enhancement type field effect transistors T13/T14 serve as sense nodes N11/N12, respectively, and are connected to the associated bit lines BLT0 and BLN0, respectively. The sense node N11 is connected to the gate electrode of the p-channel enhancement type field effect transistor T12 and the gate electrode of the n-channel enhancement type field effect transistor T14, and the other sense node N12 is connected to the gate electrode of the p-channel enhancement type field effect transistor T11 and the gate electrode of the n-channel enhancement type field effect transistor T13. Thus, the p-channel enhancement type field effect transistor T11 and the n-channel enhancement type field effect transistor T13 complementarily turn on and off depending upon the potential level at the sense node N12, and the p-channel enhancement type field effect transistor T12 and the n-channel enhancement type field effect transistor T14 complementarily turn on and off depending upon the potential level at the sense node N11. This feature is similar to the sense amplifier SA0 of the prior art ferroelectric random access memory device.

The offsetable sense amplifier OSA0 further includes a series combination of n-channel enhancement type field effect transistors T15/T16 connected in parallel to the n-channel enhancement type field effect transistor T13 between the sense node N11 and the ground line and another series combination of n-channel enhancement type field effect transistors T17/T18 connected in parallel to the n-channel enhancement type field effect transistor T14 between the sense node N12 and the ground line. The gate electrode of the n-channel enhancement type field effect transistor T15 is connected to the sense node N12, and the control signal line OST is connected to the gate electrode of the n-channel enhancement type field effect transistor T16. The gate electrode of the n-channel enhancement type field effect transistor T17 is connected to the sense node N11, and the other control signal line OSN is connected to the gate electrode of the n-channel enhancement type field effect transistor T18.

The high voltage level Vcc on the control signal line OST activates the series combination of the n-channel enhancement type field effect transistors T15/T16, and the n-channel enhancement type field effect transistors T15/T16 cooperate with the n-channel enhancement type field effect transistor T13 for discharging the current from the sense node N11. In other words, when the control signal line OST is changed to the high voltage level Vcc, the series combination of the n-channel enhancement type field effect transistors T15/T16 increase the current driving capability from the sense node N11 to the ground line. As a result, the series combination of the n-channel enhancement type field effect transistors T15/T16 gives the offset voltage +Vo to the offsetable sense amplifier OSA0 for the bit line BLT0. Similarly, the high voltage level Vcc on the control signal line OSN activates the series combination of the n-channel enhancement type field effect transistors T17/T18, and the n-channel enhancement type field effect transistors T17/T18 cooperate with the n-channel enhancement type field effect transistor T14 for discharging the current from the sense node N12. In other words, when the control signal line OSN is changed to the high voltage level Vcc, the series combination of the n-channel enhancement type field effect transistors T17/T18 increase the current driving capability from the sense node N12 to the ground line. Thus, the series combination of the n-channel enhancement type field effect transistors T17/T18 gives the offset voltage -Vo to the offsetable sense amplifier OSA0 for the bit line BLN0.

The series combination of the n-channel enhancement type field effect transistors T15/T16 gives the offset voltage +Vo to the offsetable sense amplifier OSA0 during the sense amplification for a small potential level on the bit line BLT0, and the series combination of the n-channel enhancement type field effect transistors T17/T18 gives the offset voltage -Vo to the offsetable sense amplifier OSA0 during the sense amplification for a small potential level on the other bit line BLN0. While both control signal lines OST/OSN are staying at the ground level, offsetable sense amplifier OSA0 is assumed to be sensitive to the minimum potential difference dVmin between the bit lines BLT0 and BLN0. The positive voltage level Vcc on either control signal line OST or OSN makes the series combination of the n-channel enhancement type field effect transistors T15/T16 or T17/T18 increase the minimum potential difference to ( dVmin +|Vo |). The offset voltage |Vo| is changeable. The n-channel enhancement type field effect transistors T15 to T17 may be enlarged for increasing the offset voltage |Vo|. When the manufacturer decreases the offset voltage |Vo |, the n-channel enhancement type field effect transistors T15 to T17 may be decreased in size.

Turning back to FIG. 3 of the drawings, the ferroelectric random access memory device further comprises a column selector 25 connected to the bit line pairs BLT0/BLN0 to BLTm/BLNm, data line pairs DLT0/DLN0 and DLT1/DTN1 connected to the column selector 25, data amplifiers DA0/DA1 respectively connected to the data line pairs DLT0/DLN0 and DLT1/DLN1 and write buffers WB0/WB1 also connected to the data line pairs DLT0/DLN0 and DLT1/DLN1, respectively. Though not shown in FIG. 3, a column address decoder is connected to the column selector 25, and supplies selecting signals through control signal lines YSWE to the column selector 25. The column selector 25 is responsive to the selecting signals so as to selectively connect the bit line pairs BLT0/BLN0 to BLTm/BLNm to the data line pairs DLT0/DLN0 and DLT1/DLN1. When the selecting signals indicative of the bit line pairs BLT0/BLN0 and BLTm/BLNm are in the high voltage level Vcc, the potential differences are directly transferred from the bit line pairs BLT0/BLN0 and BLTm/BLNm to the data line pairs DLT0/DLN0 and DLT1/DLN1, respectively.

A write-enable signal is supplied through a control signal line WE to the write buffers WE0/WB1, and the write buffers WB0/WB1 are enabled with the write-enable signal of the active high voltage level Vcc so as to produce potential differences representative of write-in data bits DI0/DI1 on the associated data line pairs DLT0/DLN0 and DLT1/DLN1. The potential differences representative of the write-in data bits DI0/DI1 are transferred through the column selector 25 to selected bit line pairs, and the write-in data bits are stored into selected ferroelectric memory cells.

The data amplifiers DA0/DA1 are responsive to the potential differences on the data line pairs DLT0/DLN0 and DLT1/DLN1 so as to produce output data signals DO0/DO1 representative of the read-out data bits.

When the ferroelectric random access memory device is used as a data storage in an electronic system, the control signal lines OST/OSN are fixed to the ground level, and data bits are read out from and written into selected ferroelectric memory cells as similar to the prior art ferroelectric random access memory device. For this reason, description on the data read-out and the data write-in are omitted from the present specification for the sake of simplicity.

The manufacturer checks products of the ferroelectric random access memory device to see whether or not the ferroelectric memory cells have large polarization hysteresis loops as follows. First, a tester (not shown) supplies the instruction signal TEST representative of a life test to the test control circuit 24, the test control circuit 24 changes the control signal line OST to the high voltage level Vcc, and the offset voltage Vo is given to the sense amplifiers OSA0 to OSAm for the bit lines BLT0 to BLTm. The tester writes a test bit of logic "1" level into all the ferroelectric memory cells MC00 to MCnm, and, thereafter, sequentially reads out the test bits from the memory cells MC00 to MCnm If the ferroelectric capacitors CP1 of all the memory cells MC00 to MCnm have large polarization hysteresis loops, the output data signals DO0/DO1 are indicative of logic "1" level for all the ferroelectric memory cells MC00 to MCnm.

Subsequently, the test control circuit 24 recovers the control signal line OST to the ground level, and changes the other control signal line OSN to the high voltage level Vcc. Then, the offset voltage |Vo| is given to the offsetable sense amplifiers OSA0 to OSAm for the other bit lines BLN0 to BLNm. The tester writes a test bit of logic "0" level into all the ferroelectric memory cells MC00 to MCnm, and sequentially reads out the test bits from the ferroelectric memory cells MC00 to MCnm. If the ferroelectric capacitors CP2 of all the memory cells MC00 to MCnm have large polarization hysteresis loops, the output data signals DO0/DO1 are indicative of logic "0" level for all the ferroelectric memory cells MC00 to MCnm.

Assuming now that a ferroelectric memory cell has a small polarization hysteresis loop, which does not allow the manufacturer to guarantee the product, the output data signal DO1 or DO1 is indicative of the opposite logic level, and the tester specifies the address assigned to the short-lived ferroelectric memory cell. The manufacturer rejects the short-lived product, or replaces the short-lived ferroelectric memory cell with a long-lived ferroelectric memory cell by using a redundancy technology. In this way, the manufacturer examines the products to see whether the memory cell array 22 contains a short-lived ferroelectric memory cells, which does not allow the manufacturer to guarantee the product before the delivery to user, and test improves the reliability of the products.

As will be understood from the foregoing description, the control signal lines OST/OSN give the offset voltage |Vo| to the offsetable sense amplifiers OSA0 to OSAm for potential levels on the bit lines BLT0 to BLTm and the other bit lines BLN0 to BLNm, and the tester can examine the ferroelectric memory cells whether to be short-lived or not. Each of the offsetable sense amplifiers OSA0 to OSAm only requires four field effect transistors, and the additional field effect transistors does not occupy wide area.

In the first embodiment, the series combination of the n-channel enhancement type field effect transistors T15/T16, the other series combination of the n-channel enhancement type field effect transistors T17/T18 and the control signal lines OST/OSN as a whole constitute a short-lived cell detecting means, and the column selector 25, the data line pairs DLT0/DLN0 and DLT1/DLN1, the data buffers DA0/DA1 and the write amplifiers WB0/WB1 as a whole constitute a data interface.

Second Embodiment

Figure 5:
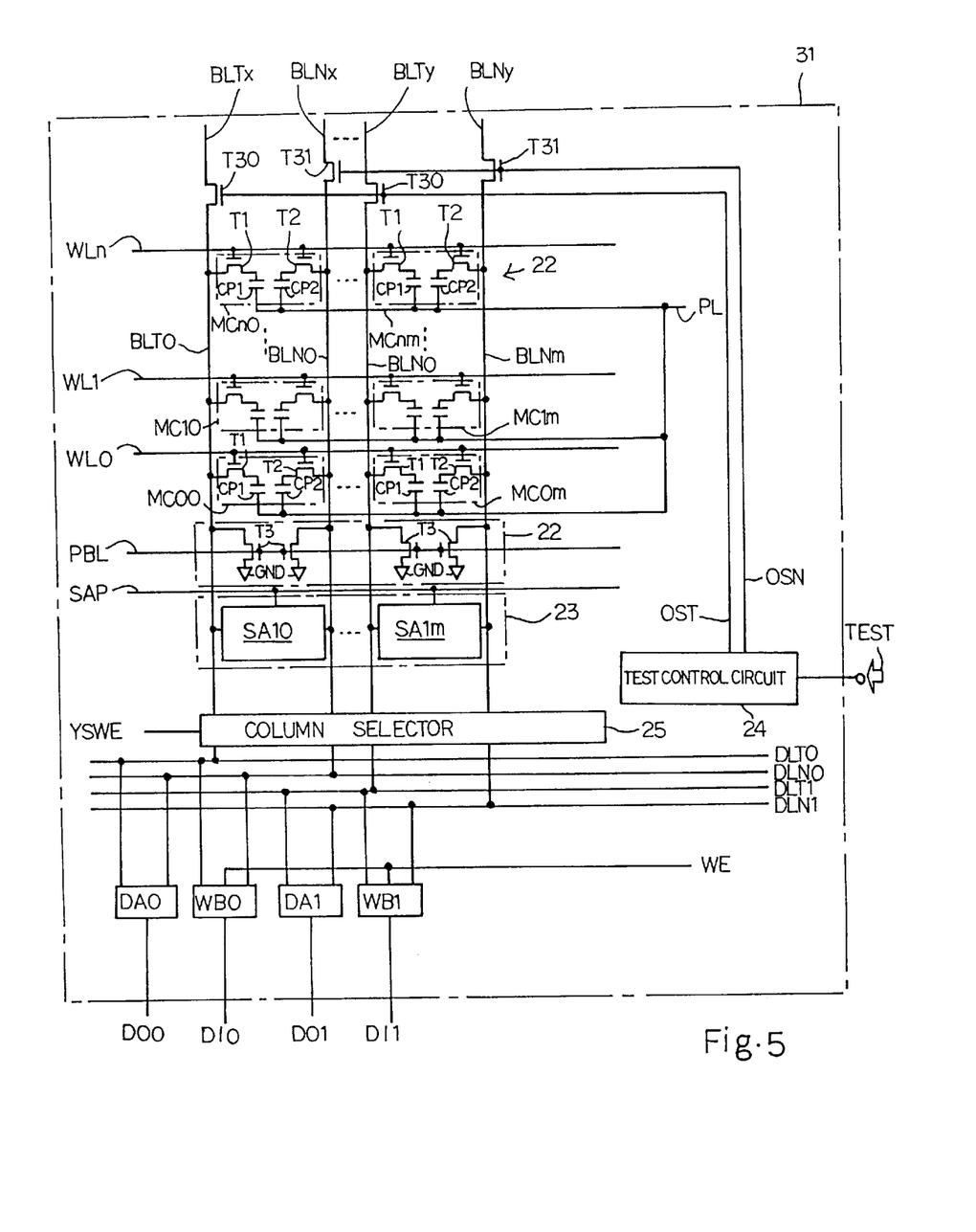
FIG. 5 is a circuit diagram showing another ferroelectric random access memory device according to the present invention.

FIG. 5 illustrates another ferroelectric random access memory device embodying the present invention fabricated on a semiconductor chip 31. The ferroelectric random access memory device is similar to the first embodiment except sense amplifiers SA1 to SA1 m and dummy bit line pairs BLTx/BLNx to BLTy/BLNy. For this reason, the other circuit components of the second embodiment are labeled with the same references designating corresponding circuit components of the first embodiment without detailed description for the sake of simplicity.

The sense amplifiers SA10 to SA1m are non-offsetable, and the circuit configuration is similar to that shown in FIG. 2. The dummy bit line pairs BLTx/BLNx to BLTy/BLNy are respectively associated with the bit line pairs BLT0/BLN0 to BLTm/BLNm, and n-channel enhancement type field effect transistors T30/T31 are connected between the bit lines BLT0 to BLTm and the dummy bit lines BLTx to BLTy and between the bit lines BLN0 to BLNm and the dummy bit lines BLNx to BLNy. The n-channel enhancement type field effect transistors T30 are gated by the control signal line OST, and the n-channel enhancement type field effect transistors T31 are gated by the other control signal line OSN.

In the test sequence, the test control circuit 24 selectively changes the control signal lines OST/OSN to the high voltage level Vcc so as to connect the dummy bit lines BLTx to BLTy or the dummy bit lines BLNx to BLNy to the bit lines BLT0 to BLTm or the bit lines BLN0 to BLNm. The potential difference on the bit line pairs BLT0/BLN0 to BLTm/BLNm are proportional to the ratio between the remanence of the ferroelectric capacitors CP1 and the parasitic capacitance of the bit lines. The dummy bit lines BLTx to BLTy and the dummy bit lines BLNx to BLNy add parasitic capacitors to the bit lines BLT0 to BLTm or BLTm to BLNm, and make the potential difference on the bit line pairs BLT0/BLN0 to BLTm/BLNm smaller than usual. For this reason, if a ferroelectric capacitor Cp1/CP2 has a small polarization hysteresis loop, the associated sense amplifier can not increase the potential difference, and the tester notices the short-lived ferroelectric memory cell from the output data signal DO0 or DO1.

As will be appreciated from the foregoing description, the dummy bit lines allow the tester to find a short-lived ferroelectric memory cell. In the second embodiment, the dummy bit line pairs BLTx/BLNx to BLTy/BLNy, the n-channel enhancement type field effect transistors T30/T31 and the control signal lines OST/OSN as a whole constitute a short-lived cell detecting means.

Although a particular embodiment of the present invention has been shown and described, it will be apparent to those skilled in the art that various changes and modifications may be made without departing from the spirit and scope of the present invention.

For example, the offset voltage |Vo| may be changed by increasing or decreasing the series combinations of the n-channel enhancement type field effect transistors T15 to T17.

The present invention is applicable to a semiconductor dynamic random access memory, the memory cell of which is implemented by two access transistors and two storage capacitors of the type having a dielectric layer sandwiched between electrodes for storing a data bit in the form of electric charge.

A dummy bit line may be shared between the bit lines of each pair, and a dummy capacitor may be selectively connected to the sense nodes of each sense amplifier.

A ferroelectric memory cell may have only one ferroelectric capacitor.

What is claimed is:

1. A ferroelectric random access memory device comprising:
   a plurality of addressable memory cells each having a ferroelectric capacitive means for storing a data bit in the form of remanence variable along a hysteresis loop;
   a plurality of bit lines selectively connected to said plurality of addressable memory cells, and propagating potential differences produced due to said remanence of said ferroelectric capacitive means of addressable memory cells selected from said plurality of addressable memory cells therefrom and thereto;
   a plurality of sense amplifiers selectively connected to said plurality of bit lines for increasing the magnitude of said potential differences;
   an data interface selectively connected to said plurality of bit lines for producing a diagnostic signal representative of existence of at least one short-lived cell in said addressable memory cells; and
   a short-lived cell detecting means causing said plurality of sense amplifiers to produce said diagnostic signal when at least one of said addressable memory cells varies said remanence along a small hysteresis loop.

2. The ferroelectric random access memory device as set forth in claim 1, in which said plurality of bit lines includes first bit lines and second bit lines paired with said first bit lines for forming a plurality of bit line pairs, and said ferroelectric capacitive means includes a first ferroelectric capacitor having a first sub-remanence of said remanence varied along a first hysteresis sub-loop of said hysteresis loop and connectable to the first bit line of associated one of said plurality of bit line pairs and a second ferroelectric capacitor having a second sub-remanence of said remanence varied along a second hysteresis sub-loop of said hysteresis loop and connectable to said second bit line of said associated one of said plurality of bit line pairs.

3. The ferroelectric random access memory device as set forth in claim 2, further comprising a plurality of word lines selectively connected to said plurality of addressable memory cells for electrically connecting said first ferroelectric capacitor and said second ferroelectric capacitor of each of said addressable memory cells to the associated one of said plurality of bit line pairs, and a plate line connected to the first ferroelectric capacitors and said second ferroelectric capacitors of said plurality of addressable memory cells for selectively inverting the polarity thereof.

4. The ferroelectric random access memory device as set forth in claim 3, in which said short-lived cell detecting means increases the minimum potential difference sensible by said plurality of sense amplifiers.

5. The ferroelectric random access memory device as set forth in claim 4, in which each of said sense amplifiers includes a first series combination of a first transistor and a second transistor opposite in channel conductivity type to said first transistor connected between a high voltage line and a low voltage line, a second series combination of a third transistor and a fourth transistor opposite in channel conductivity type to said third transistor connected between said high voltage line and said low voltage line and a first node provided between said first transistor and said second transistor and connected between said first bit line and gate electrodes of said third and fourth transistors and a second node provided between said third transistor and said fourth transistor and connected between said second bit line and gate electrodes of said first and second transistors, and said short-lived cell detecting means includes a first current path connected between said first node and said low voltage line, a second current path connected between said second node and said low voltage line and control signal lines for selectively activating said first current path and said second current path.

6. The ferroelectric random access memory device as set forth in claim 5, in which said first current path and said second current path respectively have a third series combination of a fifth transistor and a sixth transistor connected between said first node and said low voltage line and a fourth series combination of a seventh transistor and an eighth transistor connected between said second node and said low voltage line, and said first node, said second node, one of said control signal lines and the other of said control signal lines are connected to a gate electrode of said eighth transistor, a gate electrode of said sixth transistor, a gate electrode of said fifth transistor and a gate electrode of said seventh transistor, respectively.

7. The ferroelectric random access memory device as set forth in claim 3, in which said short-circuit cell detecting means decreases each of said potential differences on associated one of said plurality of bit line pairs produced due to said remanence.

8. The ferroelectric random access memory device as set forth in claim 7, in which said short-circuit cell detecting means includes dummy bit lines selectively connected to said first bit lines and said second bit lines.

9. A semiconductor memory device comprising:
   a plurality of bit line pairs;
   a plurality of word lines;

a plurality of memory cells each including two storage capacitors for storing a data bit and two access transistors having respective current paths connected between said two storage capacitors and the bit lines of associated one of said plurality of bit line pairs and respective gate electrodes connected to associated one of said plurality of word lines;

a plurality of sense amplifiers respectively connected to said plurality of bit line pairs, and amplifying potential differences produced from the data bits stored in memory cells selected from said plurality of memory cells; and a short-lived cell detecting means causing said plurality of sense amplifiers to produce a diagnostic signal when at least one of said memory cells is short-lived.

10. A method for detecting a short-lived cell, comprising the steps of:

a) writing a test bit in memory cells;

b) making an insensible voltage range of a plurality of sense amplifier connected to a plurality of bit line pairs relatively wide with respect to potential differences on said plurality of bit line pairs representative of the test bits read out from selected memory cells;

c) activating said plurality of sense amplifiers for producing diagnostic signals representative of said test bits; and d) checking said diagnostic signals to see whether said potential differences are larger than said insensible voltage range or not.

11. The method as set forth in claim 10, in which each of said memory cells has a first ferroelectric capacitor connectable to one of the bit lines of the associated bit line pair and a second ferroelectric capacitor connectable to the other of said bit lines of said associated bit line pair, and said steps a), b), c) and d) are repeated for said first ferroelectric capacitors and said second ferroelectric capacitors.

* * * * *